US012494427B2

United States Patent
Bergogne et al.

(10) Patent No.: US 12,494,427 B2
(45) Date of Patent: Dec. 9, 2025

(54) COMPONENT WITH HIGH ELECTRON MOBILITY

(71) Applicant: Commissariat à l'Energie Atomique et aux Energies Alternatives, Paris (FR)

(72) Inventors: Dominique Bergogne, Grenoble (FR); Frédéric Rothan, Grenoble (FR)

(73) Assignee: Commissariat à l'Energie Atomique et aux Energies Alternatives, Paris (FR)

( * ) Notice: Subject to any disclaimer, the term of this patent is extended or adjusted under 35 U.S.C. 154(b) by 421 days.

(21) Appl. No.: 18/040,527

(22) PCT Filed: Aug. 26, 2021

(86) PCT No.: PCT/EP2021/073652
§ 371 (c)(1),
(2) Date: Feb. 3, 2023

(87) PCT Pub. No.: WO2022/043459
PCT Pub. Date: Mar. 3, 2022

(65) Prior Publication Data
US 2023/0307360 A1 Sep. 28, 2023

(30) Foreign Application Priority Data
Aug. 28, 2020 (FR) ..................... 2008793

(51) Int. Cl.
*H01L 23/528* (2006.01)
*H01L 23/482* (2006.01)
*H01L 23/522* (2006.01)

(52) U.S. Cl.
CPC .......... *H01L 23/528* (2013.01); *H01L 23/482* (2013.01); *H01L 23/5226* (2013.01)

(58) Field of Classification Search
CPC . H01L 23/528; H01L 23/482; H01L 23/5226; H01L 23/4824
See application file for complete search history.

(56) References Cited

U.S. PATENT DOCUMENTS

| 5,672,894 A | 9/1997 | Maeda et al. |
| 2020/0152572 A1 | 5/2020 | Smerzi et al. |

FOREIGN PATENT DOCUMENTS

| JP | 2008166480 A * | 7/2008 |
| WO | 2015157845 A1 | 10/2015 |

OTHER PUBLICATIONS

English Translation of the International Preliminary Report on Patentability for International Application No. PCT/EP2021/073652, Jan. 9, 2023, 5 pages.
International Search Report for International Application No. PCT/EP2021/073652 dated Dec. 7, 2021, 3 pages.

* cited by examiner

*Primary Examiner* — Elmito Breval
(74) *Attorney, Agent, or Firm* — Jordan IP Law LLC

(57) ABSTRACT

The present description concerns a component (100) of high electron mobility type, wherein: electrode connection tracks (144, 146) are parallel to one another; on the tracks, at least one pair (160) of current collector regions (164, 166) extend on either side of a separation (168) between the regions all the way to two opposite edges (165, 167) of the regions; and the separation is oblique with respect to the tracks and the two opposite edges are orthogonal to the tracks.

17 Claims, 3 Drawing Sheets

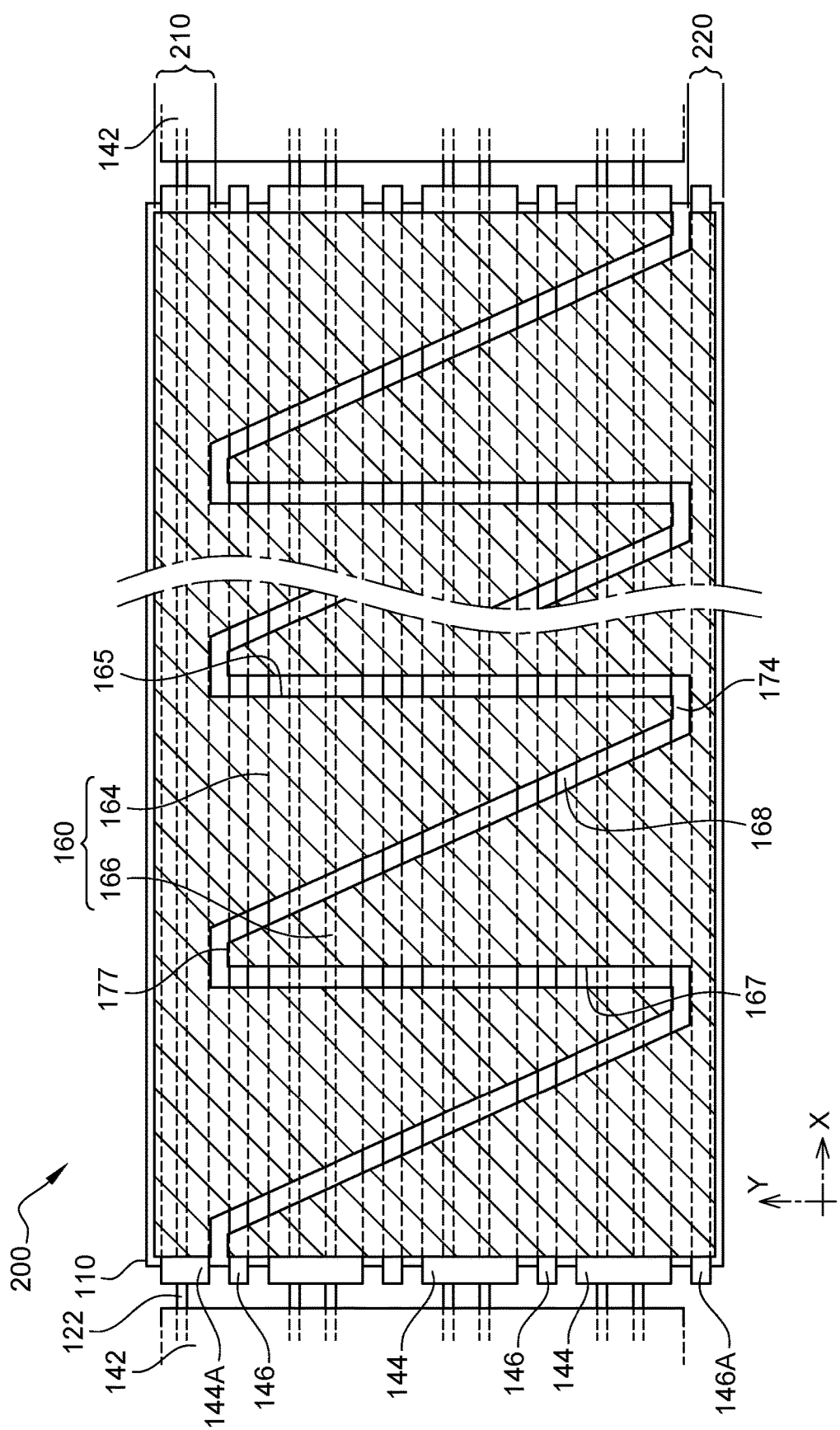

COMPONENT WITH HIGH ELECTRON MOBILITY

FIELD

The present disclosure generally concerns electronic devices and, in particular, components said to have a high electron mobility, more particularly high electron mobility components of the type called "planar".

BACKGROUND

Components, such as transistors and diodes, are of so-called high electron mobility type. These components comprise two semiconductor layers having different bandgaps and located one on top of the other. The semiconductors of the two layers, in particular their bandgaps, are selected so that the electrons are mobile along an interface between the two layers. The electrons thus made mobile define a two-dimensional electron gas.

A high electron mobility component is typically comprised in an electronic integrated circuit chip, defined by a substrate such as a portion of a wafer, preferably semiconductor, having the component located on a surface thereof. The component may be of the type called "planar", that is, it comprises connection areas or pads, all arranged on the surface of the chip having the component located thereon.

The high electron mobility component typically comprises one or a plurality of semiconductor active areas each comprising a two-dimensional electron gas. The component further comprises electric insulator layers covering the active area(s), and, in these electric insulator layers, a network of conductors which electrically connects the connection areas to the active semiconductor areas. The electric resistance exhibited by the network of conductors between the connection areas and the active areas is in series in the component and contributes to the on-state resistance of the component.

SUMMARY

There exists a need to improve known high electron mobility components, in particular to decrease the resistance of the network of conductors and/or of its occupied surface area, to decrease the bulk and/or the on-state resistance of these components.

An embodiment overcomes all or part of the disadvantages of known high electron mobility components.

An embodiment provides improving a tradeoff between a surface area occupied by a high electron mobility component and an on-state resistance of the component.

Thus, an embodiment provides a component of high electron mobility type, wherein:
  electrode connection tracks are parallel to one another;
  on the tracks, at least one pair of current collector regions extends on either side of a separation between the regions all the way to two opposite edges of the regions; and
  the separation is oblique with respect to the tracks and the two opposite edges are orthogonal to the tracks.

According to an embodiment, each of said tracks passes under at least one of the two regions.

According to an embodiment, said tracks comprise first connection tracks of first electrodes and second connection tracks of second electrodes arranged in alternated fashion.

According to an embodiment, one of the regions in the pair is connected by vias to the first tracks and another one of the regions in the pair is connected by vias to the second tracks.

According to an embodiment, said regions are portions of a same metal layer.

According to an embodiment, said pair is regularly repeated in a direction parallel to the tracks.

According to an embodiment:
  first regions of the pairs extend from a same first strip of the metal layer, the first strip extending parallel to the tracks; and
  preferably, second regions of the pairs extend from a same second strip of the metal layer, the second strip extending parallel to the tracks.

According to an embodiment, a space between neighboring pairs has a width substantially equal to a width of the separation.

According to an embodiment, said regions each have a connection area.

According to an embodiment, the areas are entirely located above said tracks and spaces between said tracks.

According to an embodiment, the connection areas of the regions connected to the first tracks are connected to a first terminal of the component, and the connection areas of the regions connected to the second tracks are connected to a second terminal of the component.

An embodiment provides an AlGaN/GaN component such as defined hereabove.

An embodiment provides a transistor comprising one or a plurality of components such as defined hereabove.

According to an embodiment, the transistor comprises drain, gate, and source electrodes forming strips elongated parallel to the tracks, the drain electrodes being connected by vias to drain tracks among said tracks, and the source electrodes being connected by vias to source tracks among said tracks.

According to an embodiment, the gate electrodes are located under the source tracks.

BRIEF DESCRIPTION OF THE DRAWINGS

The foregoing features and advantages, as well as others, will be described in detail in the rest of the disclosure of specific embodiments given by way of illustration and not limitation with reference to the accompanying drawings, in which:

FIG. 3 partially and schematically shows an example of another embodiment of a high electron mobility transistor.

DETAILED DESCRIPTION OF THE PRESENT EMBODIMENTS

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail. In particular, methods implemented to obtain the elements of a high electron mobility component such as an active area, electrodes, conductive tracks and conductive regions in metal levels, vias, electric insulators, contact areas and pads, etc. as well as materials and dimensions of these elements, are not described in detail, the described embodiments being compatible with usual methods of manufacturing these elements and with the usual materials and dimensions of these elements.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
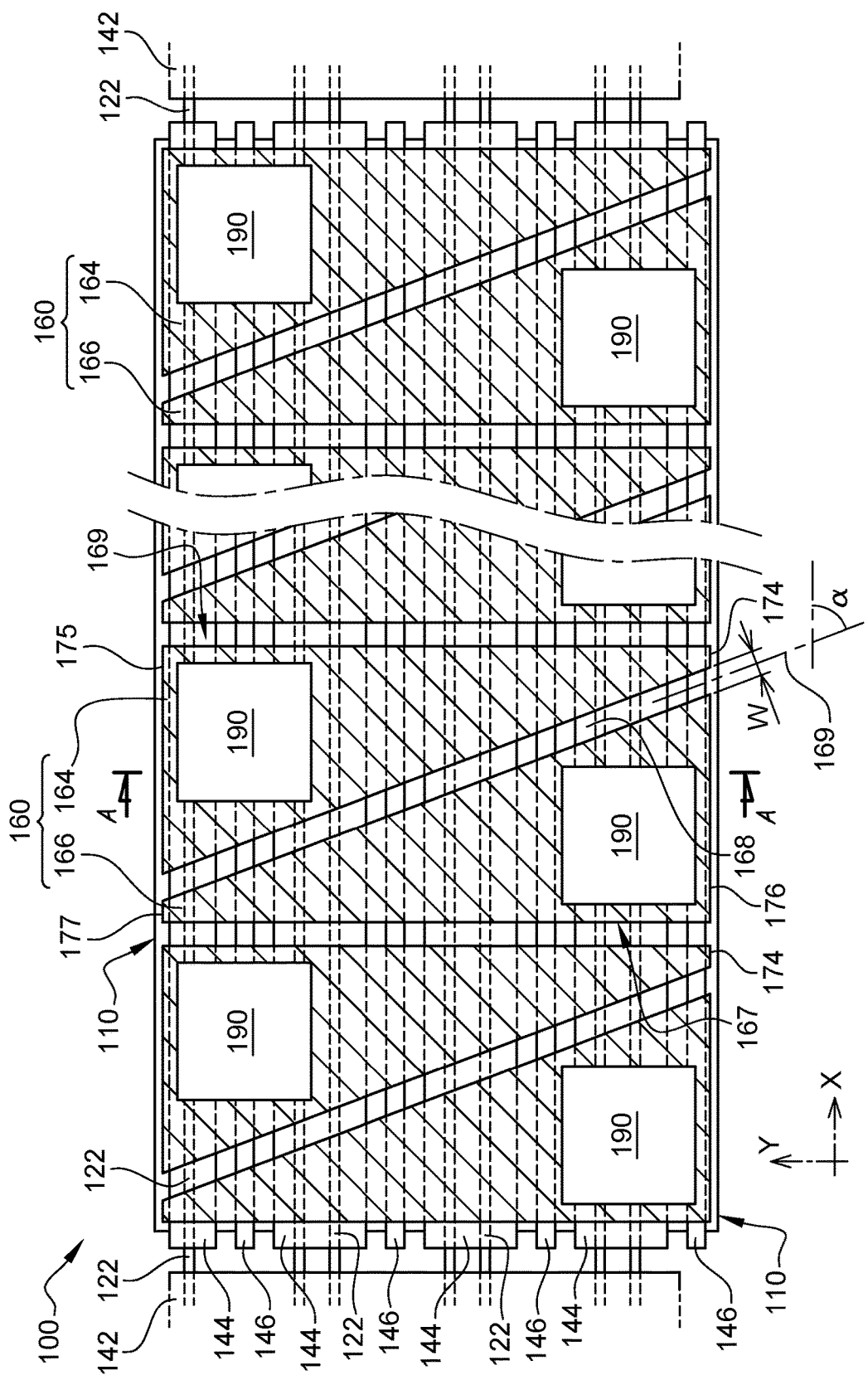
FIG. 1 partially and schematically shows a top view of an example of an embodiment of a high electron mobility transistor.
Figure 2:
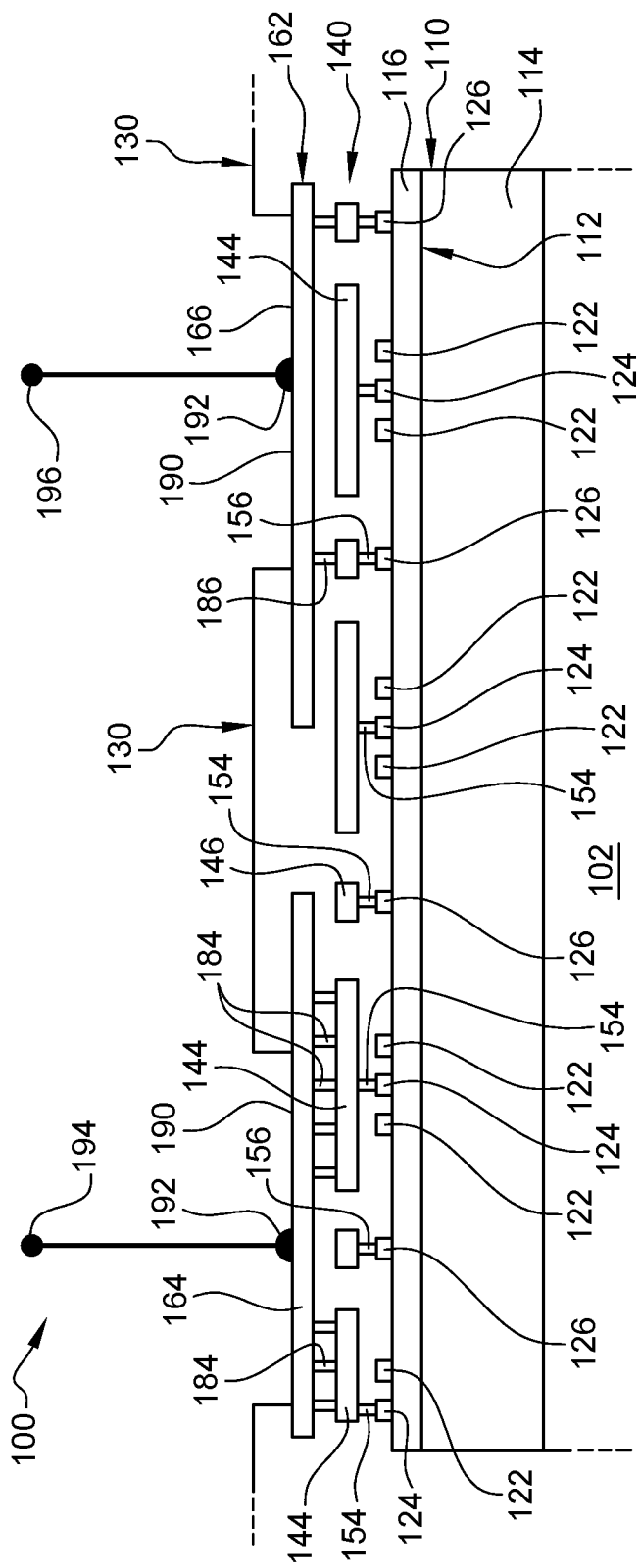
FIG. 2 partially and schematically shows a cross-section view of the transistor of FIG. 1.

FIGS. 1 and 2 partially and schematically show respective top and cross-section views along a plane A-A of an example of an embodiment of a high electron mobility transistor 100. FIG. 2 is at an enlarged scale with respect to FIG. 1.

Preferably, transistor 100 comprises, in addition to a portion shown in interrupted fashion, other portions not shown, identical, to within variations due to the manufacturing method, or similar, to the shown portion. As an example, these portions are arranged in a line or in an array.

Transistor 100 comprises a support 102 (only shown in FIG. 2), preferably formed by a portion of a wafer, more preferably made of silicon. On support 102, transistor 100 comprises a high electron mobility active area 110. By high electron mobility active area, there is meant a stack of semiconductor layers 114 and 116 forming a two-dimensional electron gas 112 along an interface between these layers. In other words, transistor 100 is of high electron mobility transistor, HEMT, type. Preferably, layers 114 and 116 are respectively made of gallium nitride GaN and of aluminum gallium nitride AlGaN covering GaN layer 114. In other words, transistor 100 is of HEMT type comprising AlGaN/GaN.

Transistor 100 comprises gate, source, and drain electrodes 122, 124 (only shown in FIG. 2), and 126 (only shown in FIG. 2) located on active area 110. These electrodes 122, 124, and 126 form, in top view, strips elongated along a direction X (horizontal in FIG. 1, and orthogonal to the plane of FIG. 2). In other words, each of the gate, source, and drain electrodes 122, 124, and 126 forms a rectilinear bar having as main direction the X direction.

Preferably, the drain and source electrodes 126 and 124 are arranged in alternated fashion in a direction Y orthogonal to the X direction, and the gate electrodes 122 are interposed between the drain and source electrodes 126 and 124.

Transistor 100 comprises a metal level 140. By metal level, there is meant a metal layer located between insulator layers 130. More precisely, this metal layer is incomplete, portions of this layer forming metal regions electrically insulated from one another so that these regions form electric connections such as tracks.

Metal level 140 comprises source tracks 144 and drain tracks 146. Sources and drain tracks 144 and 146 have, in top view, shapes of rectilinear strips having the X direction as a main direction. Drain and source tracks 146 and 144 are thus parallel to one another.

Preferably, drain electrodes 126 are entirely located under drain tracks 146, and source electrodes 124 are entirely located under source tracks 144. Drain electrodes 126 are then connected by vias 156 to drain tracks 146, and source electrodes 124 are connected by vias 154 to source tracks 144.

Preferably, source and drain tracks 144 and 146 have a same length (that is, a same dimension in the X direction) and have their ends aligned along the Y direction.

Preferably, each source track 144 extends in the Y direction from the location above (that is, vertically in line with, in the orientation of the cross-section view) the concerned source electrode 124, and covers a gate electrode 122 or the two gate electrodes 122 located on either side of source electrode 124. Gate electrodes 122 are thus located under source tracks 144. Source tracks 144 thus form electrostatic shields for gate electrodes 122.

Preferably, gate electrodes 122 protrude from the ends of source tracks 144. In other words, gate electrodes 122 have a length greater than that of source tracks 144 and have, beyond the ends of source tracks 144, portions which are not covered with source tracks 144.

Preferably, two metal regions 142 are arranged on either side of drain and source tracks 146 and 144 in the X direction on the portions of gate electrodes 122 which are not covered with source tracks 144. Gate electrodes 122 are then connected to metal regions 142 by vias, not shown. More preferably, metal regions 142 are regions of metal level 140. Metal regions 142 are preferably rectangular, elongated in the Y direction.

Preferably, one and/or the other of metal regions 142 is common to the portion shown in interrupted fashion and to another identical portion of transistor 100 (to within variations due to the manufacturing), for example, located in a same line or a same row of the array, the line or the row being a repetition in the X direction of portions identical to that shown. As an example, the transistor is formed of two portions identical to the shown portion. As a variant, the transistor comprises a single item of the shown portion.

Transistor 100 comprises, on drain and source tracks 146 and 144, pairs 160 of conductive regions 164 and 166 (hatched in FIG. 1). In each pair 160, regions 164 and 166 are separate, that is, a space 168, or separation, isolates regions 164 and 166 from each other. Separation 168 has, in top view, the shape of a strip between regions 164 and 166.

Region 164 extends, along the X direction, from separation 168 to an edge 165 of region 164. Region 166 extends, along the X direction, from separation 168 to an edge 167 of region 166. In other words, regions 164 and 166 extend along the X direction in two opposite ways from separation 168 all the way to respective edges 165 and 167. Edges 165 and 167 thus form two opposite edges of pair 160.

Separation 168 is oblique with respect to source and drain tracks 144 and 146, that is, the direction of elongation of separation 168 forms with the X direction angles different from the right angle, that is an acute angle and an additional obtuse angle. Preferably, the rectilinear strip defined by separation 168 has a median axis 169 defining a main or longitudinal direction of separation 168, and a constant width (transverse dimension). Axis 169 and direction X form together an angle α preferably greater than 45 degrees, for example in the range from 50 degrees, or approximately 50 degrees, to 85 degrees, or approximately 85 degrees.

The edges of separation 168 may be rectilinear. However, the edges of separation 168 may also exhibit corrugations. Preferably, separation 168 then has, in a direction orthogonal to axis 169, a substantially constant width W. Such corrugations may enable to facilitate the obtaining, for the edges of separation 168, of a shape substantially rectilinear at the scale of width W, by forming the edges of separation 168 from a succession of segments having, with direction X, predefined angles, for example of 90 and 45 degrees. Predefined angles are typical in usual electronic component design tools. By substantially linear shape, there is meant that, for each edge of the shape, the distance between this edge and an average line is smaller than 20%, preferably 10%, more preferably 5% of the width W of the shape.

Width W may be in the range from 1 µm to 20 µm. In an example, width W is in the order of 10 µm, and the corrugations may then be in the order of 1 µm. More precisely, width W is selected to be sufficiently large to electrically isolate regions 164 and 166 when the transistor is in the off state and it blocks a voltage. As an example, the voltage blocked by the transistor may be greater than 500 V, for example in the order of 650 V.

Preferably, regions 164 and 166 are regions of a same metal level 162 located above metal level 140, in other words, regions 164 and 166 are portions of a same metal layer.

Preferably, each of drain and source tracks 146 and 144 passes under the two regions 164 and 166.

Preferably, each of source tracks 144 is coupled to region 164 by one or, preferably, a plurality of vias 184 located on the portion of source track 144 located under region 164. Thus, electrically-conductive region 164 enables to collect a current running through the source when transistor 100 is in the on state. In other words, region 164 forms a current collector region of transistor 100. Tracks 144 form tracks of connection of source electrodes 124 to region 164.

Preferably, each of drain tracks 146 is coupled to region 166 by one or, preferably, a plurality of vias 186 located on the portion of drain track 146 located under region 166. Thus, electrically-conductive region 166 enables to collect a current running through the drain when transistor 100 is on. In other words, region 166 forms another current collector region of transistor 100. Tracks 146 form tracks of connection of drain electrodes 126 to region 166.

More preferably, it is provided that between each track 144, 146 and respective region 164, 166, the respective number of vias 184, 186 is close to the largest possible number allowed by the design rules manual (DRM) for the implemented technology.

The two opposite edges 165 and 167 are rectilinear and orthogonal to the X direction. In other words, the two opposite edges 165 and 167 are orthogonal to source and drain tracks 144 and 146. Thus, due to the fact that separation 168 is oblique, each region 164, 166 has, between separation 168 and the respective edge 165, 167, the shape of a right-angled trapezoid in the case where separation 168 does not reach the respective edge 165, 167, or the shape of a right-angled triangle in the case where separation 168 reaches the respective edge 165, 167. Regions 164 and 166 have a dimension in the X direction, that is, the width of these regions, which decreases in the Y direction in one way for region 166 and in the other way for region 164.

According to an embodiment, region 164 has two opposite edges 174 and 175 parallel to the X direction, and region 166 has two opposite edges 176 and 177 parallel to the X direction. Preferably, edges 177 and 175 are collinear in the X direction and edges 174 and 176 are collinear in the X direction. Thus, regions 164 and 166 have, in top view, the shape of a rectangle interrupted by separation 168. Preferably, axis 169 runs through the center of the rectangle. Regions 164 and 166 are then, in top view, symmetrical with respect to the center of the rectangle, or symmetrical with respect to this center to within the above-described corrugations. By symmetrical, there is meant symmetrical to within variations due to the tolerances of the manufacturing method.

Preferably, pairs 160 are regularly repeated in the X direction. Preferably, the number of pairs 160 located in the portion shown in interrupted fashion, that is, between two metal regions 142, is in the range from three to ten, for example equal to three, five, six, or ten pairs. The number of pairs is selected according to the desired breakdown voltage (maximum voltage that the transistor in the off state is capable of blocking) and to the desired on-state resistance. As a variant, a single pair 160, two pairs 160, and more than ten pairs 160 may be provided. Preferably, pairs 160 are identical, to within variations due to the manufacturing method. Preferably, neighboring pairs 160 are separated by a space having in the X direction, between the edge 165 of one of pairs 160 and the edge 167 of the neighboring pair 160, a width substantially equal to the width W of separations 168.

It could have been provided for the opposite edges 165 and 167 of pair 160 to be oblique, for example, for the edges 165 and 167 of the neighboring pairs 160 to form with the X direction an angle π-α additional to angle α. As a comparison, in the embodiments, the fact of providing for opposite edges 165 and 167 to be orthogonal to tracks 144 and 146, enables the regions 164 and 166 closest to the ends of tracks 144 and 146 to have with the other regions 164 and 166 a same width decreasing in the Y direction, and enables regions 164 and 166 to cover 144 and 146 close to their ends without for some of tracks 144 and 146 to be less covered than others and without for a portion of regions 164 and 166 to extend beyond the ends of tracks 144 and 146. This enables to decrease the electric resistance of the current collection of the end of tracks 144 and 146 which, otherwise, would not be covered, and/or enables to avoid losing a portion of the transistor surface area to leave place to a region which would extend beyond the ends of tracks 144 and 146. The tradeoff between the on-state resistance of transistor 100 and the surface area of the transistor is thus improved.

According to an embodiment, each region 164, 166 exhibits a connection area 190. Connection areas 190 may each comprise an opening in insulator layers 130. The opening emerges onto the metal of the concerned region 164, 166. Connection areas 190 may comprise, in these openings, contacts 192 with the connection areas. The contacts 192 of regions 164 are connected to a source terminal 194 of transistor 100, and the contacts 192 of regions 166 are connected to a drain terminal 196 of transistor 100.

Preferably, connection areas 190 have a predefined shape, for example, square, of also predefined dimensions. Such a predefined shape, with predefined dimensions, is typical in usual connection area or connection pad design tools. It is then more preferably provided for the width along the X direction of regions 164 and 166 to enable areas 190 to be entirely located above tracks 144 and 146 and the spaces between these tracks.

In particular, the fact of providing for edges 165 and 167 to be orthogonal to tracks 144 and 146 enables to avoid, for the regions 164 and 166 closest to the ends of tracks 144 and 146, for a portion of connection area 190 to be located beyond the ends of tracks 144 and 146. Providing such a connection area portion would require an additional surface area. As a result, the provision of edges 165 and 167, and the provision of areas 190 entirely located above tracks 144 and 146 and the spaces between these tracks, enables to decrease the surface area occupied by transistor 100.

As a variant, regions 164 and 166 may extend in metal level 162 with other regions of metal level 162, and connection areas 190 may be partly located on these other regions. As compared with this variant, an advantage of providing for areas 190 to be entirely located above tracks 144 and 146 and spaces between these tracks also is to decrease the surface area of transistor 100.

FIG. 3 partially and schematically shows an example of another embodiment of a high electron mobility transistor 200.

Transistor 200 comprises elementary identical or similar to those of the transistor 100 of FIGS. 1 and 2, arranged identically or similarly. These elements will not be described again in detail. Only the differences are highlighted.

Transistor 200 differs from the transistor 100 of FIGS. 1 and 2 in that it comprises strips 210 of the metal level of regions 164 (preferably, level 162) and/or strips 220 of the metal level of regions 166 (preferably, also level 162). Preferably, strip(s) 210 and 220 replace connection areas 190, which are then omitted. As a variant, the connection areas are not omitted. Strips 210 and 220 extend in the X direction parallel to tracks 144 and 146.

Regions 164 extend on tracks 144 and 146 along the Y direction from strip 210 and, preferably, regions 166 extend on tracks 144 and 146 along the Y direction from strip 220.

In other words, strips 210 and 220, and regions 164 and 166 have the shape of interdigitated combs, the teeth or fingers of the combs having right-angled trapezoid or right-angled triangle shapes. Strip 210 electrically connects regions 164 to one another, and strip 220 electrically connects regions 166 to one another. Preferably, strip 210 is connected (by connections, not shown) to a source terminal of transistor 200, and strip 220 is connected to a drain terminal of transistor 200.

In the shown example, one of source tracks 144 (144A) is located, at least on a portion of the width of this track in the Y direction, under strip 210. Source track 144A is then connected to strip 210 by vias, not shown. In this case, each of the drain tracks 146, except for track 146A, may pass under all the regions 164 connected to source tracks 144.

In the shown example, one of the drain tracks 146 (146A) is located, at least on a portion of the width of this track, under strip 220. Drain track 146A is then connected to strip 220 by vias, not shown. In this case, preferably, each of source tracks 144, except for track 144A, passes under all the regions 166 connected to drain tracks 146.

The shown example is not limiting, and strip 210 and/or strip 220 may also be located outside of the location above the assembly formed by tracks 144 and 146 and the spaces between these tracks.

Various embodiments and variants have been described. Those skilled in the art will understand that certain features of these various embodiments and variants may be combined, and other variants will occur to those skilled in the art. In particular, although embodiments of a transistor have been described hereabove, other embodiments provide a high electron mobility diode. Those skilled in the art are capable of obtaining a diode based on the elements described hereabove for a transistor, in particular of replacing the above-described drain and source electrodes with anode and cathode electrodes of the diode.

Finally, the practical implementation of the described embodiments and variants is within the abilities of those skilled in the art based on the functional indications given hereabove.

What is claimed is:

1. A component of high electron mobility type, wherein:
   electrode connection tracks are parallel to one another;
   on the tracks, at least one pair of current collector regions extend, in the direction of the tracks, on either side of a separation between the regions all the way to two opposite edges of the regions; and
   the separation is oblique with respect to the tracks and the two opposite edges are orthogonal to the tracks.

2. The component according to claim 1, wherein the current collector regions have the shape of right-angled triangles.

3. The component according to claim 1, wherein the current collector regions have the shape of right-angled trapezoids.

4. The component according to claim 1, wherein each of said tracks passes under at least one of the two regions.

5. The component according to any of claim 1, wherein said tracks comprise first connection tracks of first electrodes and second connection tracks of second electrodes arranged in alternated fashion.

6. The component according to claim 5, wherein one of the regions in the pair is connected by vias to the first tracks and another one of the regions in the pair is connected by vias to the second tracks.

7. The component according to claim 1, wherein said regions are portions of a same metal layer.

8. The component according to claim 1, wherein said pair is regularly repeated in a direction parallel to the tracks.

9. The component according to claim 7, wherein:
   first regions of the pairs extend from a same first strip of the metal layer, the first strip extending parallel to the tracks; and
   preferably, first regions of the pairs extend from a same second strip of the metal layer, the second strip extending parallel to the tracks.

10. The component according to claim 8, wherein a space between neighboring pairs has a width substantially equal to a width of the separation.

11. The component according to claim 1, wherein said regions each have a connection area.

12. The component according to claim 11, wherein the areas are entirely located above said tracks and spaces between said tracks.

13. The component according to claim 11, wherein the current collector regions have the shape of right-angled trapezoids and wherein the connection areas of the regions connected to the first tracks are connected to a first terminal of the component, and the connection areas of the regions connected to the second tracks are connected to a second terminal of the component.

14. An AlGaN/GaN component according to claim 1.

15. A transistor comprising one or a plurality of components according to claim 1.

16. The transistor according to claim 15, comprising drain, gate, and source electrodes forming strips elongated parallel to the tracks, the drain electrodes being connected by vias to drain tracks among said tracks, and the source electrodes being connected by vias to source tracks among said tracks.

17. The transistor according to claim 16, wherein the gate electrodes are located under the source tracks.

* * * * *